Sept. 20, 1966 J. P. PIETROLEWICZ 3,274,336

HIGH VOLTAGE CIRCUIT

Filed May 18, 1962 2 Sheets-Sheet 1

INVENTOR.
JOHN P. PIETROLEWICZ
BY
Fordyce A. Bothwell
ATTORNEY

Sept. 20, 1966 J. P. PIETROLEWICZ 3,274,336

HIGH VOLTAGE CIRCUIT

Filed May 18, 1962 2 Sheets-Sheet 2

INVENTOR.
JOHN P. PIETROLEWICZ
BY
Fordyce A. Bothwell
ATTORNEY

3,274,336
HIGH VOLTAGE CIRCUIT

John P. Pietrolewicz, Pennsauken, N.J., assignor to Philco Corporation, Philadelphia, Pa., a corporation of Delaware Filed May 18, 1962, Ser. No. 195,785
16 Claims. (Cl. 178—7.5)

This invention relates to circuits of the type in which a high D.C. voltage is produced by rectifying time-spaced high voltage pulses occurring at a predetermined frequency. An example of such a circuit is that employed in a television receiver wherein a high D.C. voltage is produced by rectifying flyback pulses derived from the horizontal output transformer. The high D.C. voltage thus produced may be applied to the image-reproducing cathode ray tube; for example, it may be applied to a focussing electrode of said tube.

In such a circuit it is desirable to be able to adjust the amplitude of the high D.C. voltage. Prior arrangements for this purpose have not been entirely satisfactory. In general they have been too expensive and/or they have involved objectionable energy losses.

The principal object of this invention is to provide an improved voltage adjusting arrangement in such a circuit which overcomes the objections of prior arrangements.

Another object of the invention is to provide a voltage adjusting arrangement which is inexpensive and yet is highly efficient in producing the high D.C. voltage.

In accordance with this invention a tunable resonant circuit or tank circuit is provided for the purpose of adjusting the high D.C. voltage. In this arrangement energy is stored in the tank circuit by each pulse, and an oscillatory voltage appears across the tank circuit at the frequency to which the tank circuit is tuned. When the next pulse appears this voltage is vectorially added to it. The resulting voltage has an amplitude which is dependent on the tuning of the tank circuit.

The invention may be fully understood from the following detailed description with reference to the accompanying drawings wherein.

Figure 1:
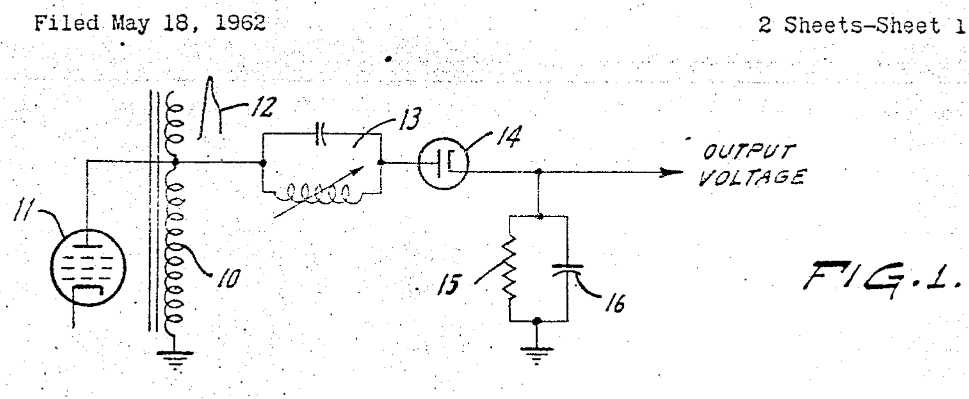
FIG. 1 is a schematic illustration of a circuit according to this invention.

Referring to FIG. 1, there are shown the horizontal output transformer 10 and the horizontal output tube 11 of a television receiver. As is well known, transformer 10 is a source of flyback pulses occurring at the line-scanning frequency, one of which is represented at 12. In accordance with this invention, a tunable resonant circuit 13 is connected to a point on the transformer. A rectifier diode 14 is connected to the resonant circuit. A load resistor 15 and capacitor 16 are connected to the diode so that the high D.C. output voltage appears across the load.

Figure 2:
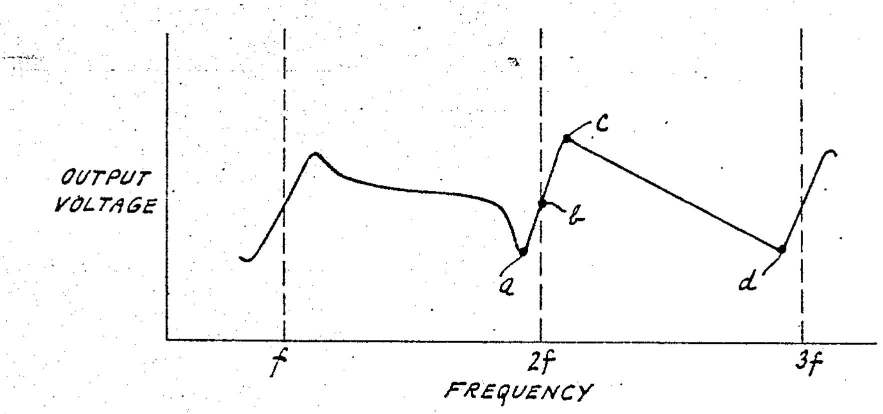
FIGS. 2 and 3 are graphs illustrating the operation of the circuit.

FIG. 2 shows how the D.C. output voltage varies with different tuning of the resonant circuit 13. In this illustration $f$ is the fundamental frequency of the flyback pulses, $2f$ is the second harmonic of said frequency, and $3f$ is the third harmonic of said frequency.

Figure 3:
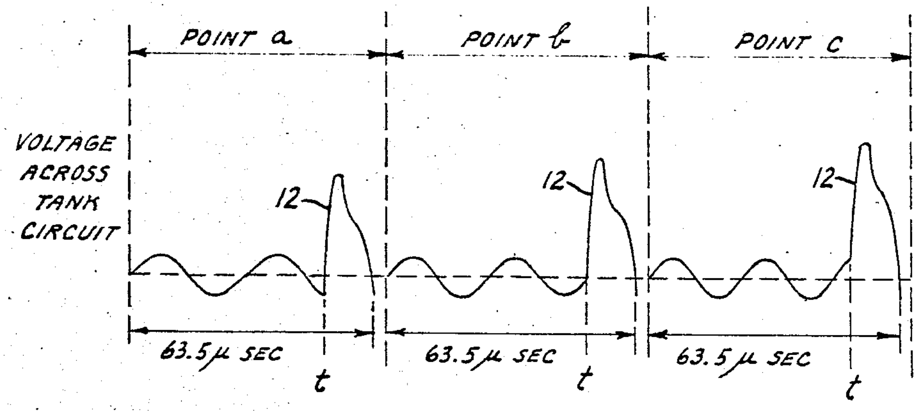

The reason why the D.C. output voltage varies as shown in FIG. 2 may be explained with the aid of FIG. 3 which shows the operation for points *a*, *b* and *c* of FIG. 2. Point *b* represents tuning of the resonant circuit precisely to the second harmonic $2f$; point *a* represents tuning of the resonant circuit to a somewhat lower frequency; and point *c* represents tuning of the resonant circuit to a somewhat higher frequency.

In operation, when the rectifier 14 is pulsed on during flyback, the charging current stores energy in the tank circuit 13. During the time intervals between flyback pulses, the voltage across the tank circuit is in the form of a damped oscillation at the frequency to which the tank circuit is tuned. When the next flyback pulse appears, this voltage is vectorially added to it. The energy remaining in the tank circuit may add to or subtract from the energy going into the load. This depends on the phasing of the oscillatory voltage at time $t$ (FIG. 3), which in turn depends on the tuning of the tank circuit.

As may be seen in FIG. 3, when the tank circuit is tuned to a frequency corresponding to point *a* of FIG. 2, the phasing of the oscillatory voltage is such that it subtracts energy at time $t$, and the amplitude of the flyback pulse 12 is decreased. When the tank circuit is tuned to a frequency corresponding to point *b* of FIG. 2, the phasing of the oscillatory voltage is such that it neither adds nor subtracts energy at time $t$, and the amplitude of the flyback pulse is neither decreased nor increased. When the tank circuit is tuned to a frequency corresponding to point *c* of FIG. 2, the phasing of the oscillatory voltage is such that it adds energy at time $t$, and the amplitude of the flyback pulse is increased.

From the foregoing explanation it will be apparent that by tuning the resonant circuit 13 over a selected range of frequencies the amplitude of the pulses supplied to rectifier 14, and consequently the amplitude of the output voltage, may be varied over a certain range. Thus the output voltage is varied without the use of objectionable taps or resistance elements.

The energy stored in the tank circuit is initially stored in the inductance. The energy available at time $t$ is dependent upon the circuit Q. Therefore the available output voltage range is proportional to the product of L and Q or the resonant impedance of the tank circuit. In experimental practice of the invention the frequency range between points *c* and *d* of FIG. 2, between the second and third harmonics of the flyback pulse frequency $f$, was chosen since it gives a more gradual change of output voltage.

While it is possible to reverse the positions of the tank circuit 13 and the diode 14, this has been found to give a decrease in the range of amplitude adjustment and is therefore less desirable.

Figure 4:
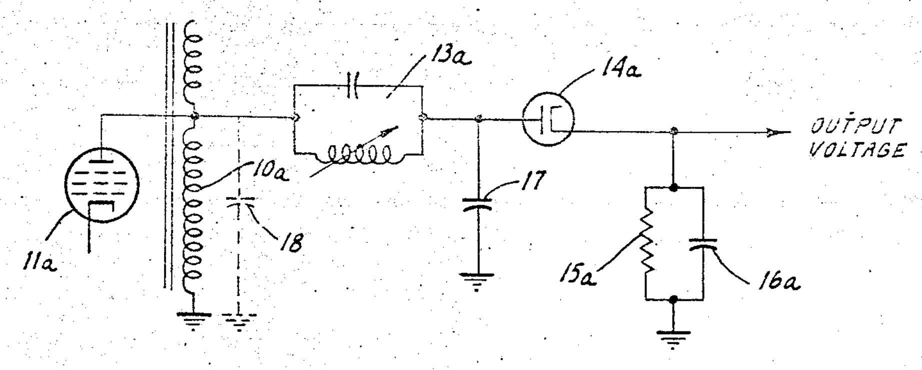
FIGS. 4 and 5 are schematic illustrations of other embodiments of the invention.

Referring now to FIG. 4, the circuit there shown is similar to that of FIG. 1 except for the addition of capacitor 17. This capacitor is in series with the transformer distributed capacitance 18 across the tank circuit during the intervals between flyback pulses. During said pulses, however, capacitor 17 loads the tank circuit, thereby coupling more energy from the transformer into the tank circuit. This produces a marked increase in range of amplitude adjustment.

Figure 5:
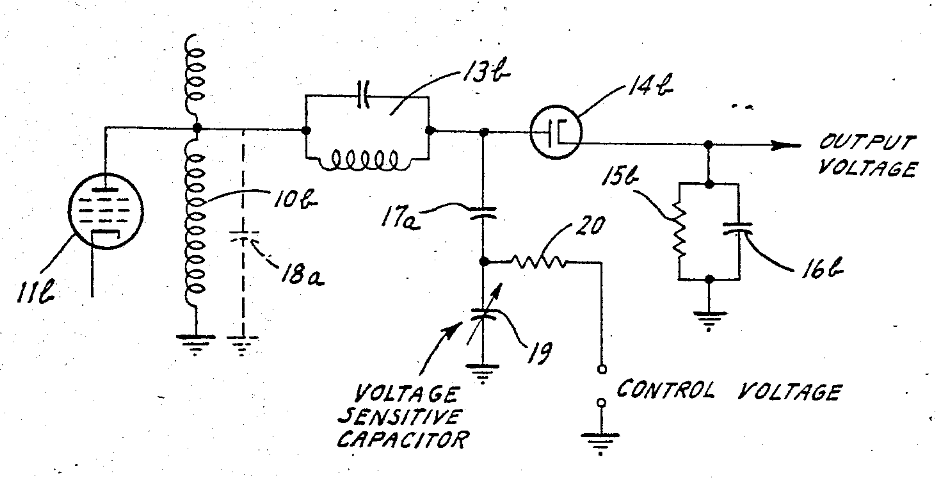

Referring now to FIG. 5, the circuit there shown is similar to that of FIG. 4 but in this instance the inductance of the tank circuit **13*b* is fixed and a voltage-sensitive capacitor 19 is provided. A control voltage is applied across capacitor 19 through resistor 20. In this circuit arrangement an increase, for example, in the capacitance of capacitor 19** not only changes the tuning but also increases the energy input to further boost the output voltage.

While certain embodiments of the invention have been illustrated and described, it is to be understood that the invention is not limited thereto but contemplates such modifications and further embodiments as may occur to those skilled in the art.

What I claim is:

1. A circuit for providing a manually-variable high D.C. voltage from a source of time-spaced high-voltage pulses occurring at a predetermined frequency, comprising: a manually-tunable parallel-resonant circuit, a diode and a load impedance, all connected in series to said source, said resonant circuit being tunable over a range of frequencies; and means for deriving said high D.C. voltage from across said impedance.

2. A circuit for providing a manually-variable high D.C. voltage from a source of time-spaced high-voltage pulses occurring at a predetermined frequency, comprising: a manually-tunable parallel-resonant circuit connected to said source and tunable over a frequency range; a rectifier diode serially connected to said resonant circuit; a capacitor connected to a point between said resonant circuit and said diode and to a point of reference potential; and a load impedance connected to said diode and across which said high D.C. voltage appears.

3. A circuit for providing a manually-variable high D.C. voltage from a source of time-spaced high-voltage pulses occurring at a predetermined frequency, comprising: a tank circuit connected to said source; a rectifier diode serially connected to said tank circuit; capacitance means, including a voltage-sensitive capacitor, connected to a point between said tank circuit and said diode and to a point of reference potential; means for applying a control voltage across said capacitor; and a load impedance connected to said diode and across which said high D.C. voltage appears.

4. In a television receiver wherein flyback pulses occurring at line-scanning frequency are derived from a horizontal output transformer and are supplied to rectifier means to produce a high D.C. voltage, the improvement which comprises the provision of resonant means serially connected in circuit with said transformer and said rectifier means and tunable over a frequency range for varying the amplitude of said high D.C. voltage.

5. In a television receiver, a horizontal output transformer across which flyback pulses are produced occurring at the line-scanning frequency, a manually-tunable parallel-resonant circuit connected to said transformer and tunable over a frequency range, a rectifier diode connected to said resonant circuit, and load means connected to said diode and across which a high D.C. voltage appears having an amplitude dependent on the manual tuning of said resonant circuit.

6. In a television receiver, a horizontal output transformer across which flyback pulses are produced occurring at the line-scanning frequency, a manually-tunable parallel-resonant circuit connected to said transformer and tunable over a frequency range, a rectifier diode serially connected to said resonant circuit, a capacitor connected to a point between said resonant circuit and said diode and to a point of reference potential, and load means connected to said diode and across which a high D.C. voltage appears having an amplitude dependent on the manual tuning of said resonant circuit.

7. In a television receiver, a horizontal output transformer across which flyback pulses are produced occurring at the line-scanning frequency; a tank circuit connected to said transformer; a rectifier diode serially connected to said tank circuit; capacitance means, including a voltage-sensitive capacitor, connected to a point between said tank circuit and said diode and to a point of reference potential; means for applying a control voltage across said capacitor; and a load impedance connected to said diode and across which a high D.C. voltage appears.

8. A direct-current (D.C.) power supply for providing an adjustable high voltage in a television receiver having a horizontal deflection yoke which is transformer-coupled to a sweep-signal source, said power supply comprising: a resonant circuit tuned to an integral multiple of the horizontal-scanning frequency of the receiver; means for connecting said resonant circuit across a selected portion of said transformer to cause excitation of said resonant circuit and the generation of an alternating-current (A.C.) signal component of sinusoidal waveform upon which is superposed a high-potential pulse developed in said transformer during line retrace intervals; a rectifier having a load circuit for developing a D.C. potential; and means for connecting said rectifier to said resonant circuit to apply said high-potential pulse and said A.C. component thereto; said resonant circuit including an adjustable reactance for varying the phase relation of said pulse and said A.C. component to control the magnitude of the D.C. potential developed in said load circuit.

9. A circuit for providing an adjustable high D.C. voltage, comprising a source of time-spaced high-voltage pulses occurring at a predetermined frequency, said source having first and second terminals, a tunable resonant circuit connected to the first terminal of said source, a rectifier diode serially connected to said resonant circuit, a capacitor connected to a point between said resonant circuit and said diode and to the second terminal of said source, a load impedance connected to the output side of said diode and to the second terminal of said source, and means for deriving a high D.C. voltage from across said load impedance.

10. A circuit for providing an adjustable high D.C. voltage, comprising a source of time-spaced high-voltage pulses occurring at a predetermined frequency, said source having first and second terminals, a resonant circuit connected to the first terminal of said source, a rectifier diode serially connected to said resonant circuit, capacitance means including a voltage-sensitive capacitor connected to a point between said resonant circuit and said diode and to the second terminal of said source, means for applying a control voltage across said capacitor, a load impedance connected to the output side of said diode and to the second terminal of said source, and means for deriving a high D.C. voltage from across said load impedance.

11. In a television receiver having a deflection system, a direct current (D.C.) voltage supply for providing a high voltage of adjustable magnitude comprising: means for deriving from said deflection system a recurring high-potential pulse having a recurrence frequency corresponding to a characteristic frequency of said deflection system; means for developing an alternating current (A.C.) signal component having a frequency approximately equal to an integral multiple of the frequency of said pulse; a rectifier having a load circuit for developing a D.C. potential; means for concurrently applying said pulse and said A.C. component to said rectifier to develop in said load circuit a D.C. potential having a magnitude related to the combined magnitudes of said pulse and said A.C. component; and means for varying the relative phase of said pulse and said A.C. component to control the magnitude of the D.C. potential developed in said load circuit.

12. In a television receiver having a deflection system, a direct-current (D.C.) voltage supply for providing a high voltage of adjustable magnitude comprising: means for deriving from said deflection system a recurring high-potential pulse having a recurrence frequency corresponding to a characteristic frequency of said deflection system; means for developing an alternating-current (A.C.) signal component having a frequency approximately equal to an integral multiple, greater than one, of the frequency of said pulse; a rectifier having a load circuit for developing a D.C. potential; means for concurrently applying said pulse and said A.C. component to said rectifier to develop in said load circuit a D.C. potential having a magnitude related to the combined magnitudes of said pulse and said A.C. component; and means for varying the relative phase of said pulse and said A.C. component to control the magnitude of the D.C. potential developed in said load circuit.

13. In a television receiver having a line-scan deflection system, a direct-current (D.C.) voltage supply for providing a high voltage of adjustable magnitude comprising: means for deriving from said deflection system a recurring high-potential pulse having a recurrence frequency corresponding to the line-scanning frequency of said deflection system; means for developing an alternating-current (A.C.) signal component having a frequency approximately equal to an integral multiple of the frequency of said pulse; a rectifier having a load circuit for developing a D.C. potential; means for concurrently applying said pulse and said A.C. component to said rectifier to develop in said load circuit a D.C. potential having a magnitude related to the combined magnitudes of said pulse and said A.C. component; and means for varying the relative phase of said pulse and said A.C. component to control the magnitude of the D.C. potential developed in said load circuit.

14. In a television receiver having a deflection system, a direct-current (D.C.) voltage supply for providing a high voltage of adjustable magnitude comprising: means for deriving from said deflection system a recurring high-potential pulse having a recurrence frequency corresponding to a characteristic frequency of said deflection system; means, including a resonant circuit coupled to said deflection system and tuned to a frequency approximately equal to an integral multiple of the frequency of said pulse, for developing an alternating-current (A.C.) signal component; a rectifier having a load circuit for developing a D.C. potential, means for concurrently applying said pulse and said A.C. component to said rectifier to develop in said load circuit a D.C. potential having a magnitude related to the combined magnitudes of said pulse and said A.C. component; and means for varying the relative phase of said pulse and said A.C. component to control the magnitude of the D.C. potential developed in said load circuit.

15. In a television receiver having a deflection system, a direct-current (D.C.) voltage supply for providing a high voltage of adjustable magnitude comprising: means for deriving from said deflection system a recurring high-potential pulse having a recurrence frequency corresponding to a characteristic frequency of said deflection system; means, including a tunable resonant circuit coupled to said deflection system and tuned to a frequency approximately equal to an integral multiple of the frequency of said pulse for developing an alternating-current (A.C.) signal component; a rectifier having a load circuit for developing a D.C. potential; means for concurrently applying said pulse and said A.C. component to said rectifier to develop in said load circuit a D.C. potential having a magnitude related to the combined magnitudes of said pulse and said A.C. component; and means, comprising an adjustable reactance included in said resonant circuit, for varying the relative phase of said pulse and said A.C. component to control the magnitude of the D.C. potential developed in said load circuit.

16. A direct-current (D.C.) power supply for providing an adjustable high voltage in a television receiver having a horizontal deflection yoke which is transformer-coupled to a sweep signal source, said power supply comprising: a resonant circuit tuned to an integral multiple of the horizontal-scanning frequency of the receiver; means for connecting said resonant circuit across a selected portion of said transformer to cause excitation of said resonant circuit and the generation of an alternating-current (A.C.) signal component of sinusoidal waveform upon which is superposed a high-potential pulse developed in said transformer during line retrace intervals; a diode rectifier having a cathode and an anode and further having a cathode load circuit for developing a D.C. potential; and means for connecting said anode of said rectifier to said resonant circuit to apply said high-potential pulse and said A.C. component thereto; said resonant circuit including an adjustable reactance for varying the phase relation of said pulse and said A.C. component to control the magnitude of the D.C. potential developed in said load circuit.

References Cited by the Examiner

UNITED STATES PATENTS

| | | | |
|---|---|---|---|
| 2,601,153 | 6/1952 | Knitht | 315—27 X |
| 2,655,615 | 10/1953 | Seldin | 315—27 |
| 2,867,750 | 1/1959 | Vonderschmitt | 315—22 |

DAVID G. REDINBAUGH, *Primary Examiner.*

R. MURRAY, J. McHUGH, *Assistant Examiners.*